(12) United States Patent
Lee

(10) Patent No.: US 7,602,224 B2
(45) Date of Patent: Oct. 13, 2009

(54) SEMICONDUCTOR DEVICE HAVING DELAY LOCKED LOOP AND METHOD FOR DRIVING THE SAME

(75) Inventor: Ki-Won Lee, Kyoungki-do (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 25 days.

(21) Appl. No.: 12/003,550

(22) Filed: Dec. 28, 2007

(65) Prior Publication Data

US 2008/0284475 A1  Nov. 20, 2008

(30) Foreign Application Priority Data

May 16, 2007 (KR) ...................... 10-2007-0047500
Jun. 28, 2007 (KR) ...................... 10-2007-0064134

(51) Int. Cl.
*H03L 7/06* (2006.01)

(52) U.S. Cl. ........................................ 327/158; 327/161

(58) Field of Classification Search ................ 327/158, 327/161
See application file for complete search history.

(56) References Cited

U.S. PATENT DOCUMENTS

| | | | |
|---|---|---|---|
| 6,507,230 B1 * | 1/2003 | Milton | ........................ 327/291 |
| 6,813,197 B2 | 11/2004 | Park | |
| 6,989,700 B2 | 1/2006 | Kim | |
| 7,103,133 B2 | 9/2006 | Jung | |
| 7,154,311 B2 | 12/2006 | Lim | |
| 7,170,313 B2 | 1/2007 | Shin | |
| 7,397,875 B2 * | 7/2008 | Primrose et al. | ............ 375/354 |
| 2006/0267649 A1 | 11/2006 | Park et al. | |

FOREIGN PATENT DOCUMENTS

| | | |
|---|---|---|
| JP | 11-316618 | 11/1999 |
| JP | 2004-201348 | 7/2004 |
| JP | 2005-251370 | 9/2005 |
| KR | 10-2001-0026746 A | 4/2001 |
| KR | 10-2001-0091534 A | 10/2001 |
| KR | 10-2003-091015 | 12/2003 |

(Continued)

OTHER PUBLICATIONS

Korean Office Action, with English translation, issued in Korean Patent Application No. KR 10-2007-0047500, mailed May 28, 2008.

(Continued)

*Primary Examiner*—Kenneth B. Wells
(74) *Attorney, Agent, or Firm*—Mannava & Kang, P.C.

(57) ABSTRACT

A delay locked loop includes: a control voltage generator configured to generate a voltage control signal having a voltage level corresponding to a phase difference between an external clock and a feedback clock; a voltage controlled delay line configured to generate a plurality of output signals by reflecting a different delay time on the external clock in response to the voltage control signal; an internal clock multiplexer configured to output one of the plurality of output signals as an internal clock in response to a skew information signal; a delay replica model configured to output the feedback clock by reflecting a delay of an actual clock/data path on the internal clock; and a skew information signal generator configured to generate the skew information signal.

12 Claims, 9 Drawing Sheets

FOREIGN PATENT DOCUMENTS

| | | |
|---|---|---|
| KR | 10-0512935 | 12/2003 |
| KR | 10-2005-0041677 A | 5/2005 |

OTHER PUBLICATIONS

Khan, Q., et al., "Techniques for On-Chip Process Voltage and Temperature Detection and Compensation", Proceedings of the 19th International Conference on VLSI Design (VLSID '06), 2006, IEEE Computer Society.

Korean Notice of Allowance issued in Korean Patent Application No. KR 10-2007-0064134, dated Aug. 25, 2008.

* cited by examiner

890B

SEMICONDUCTOR DEVICE HAVING DELAY LOCKED LOOP AND METHOD FOR DRIVING THE SAME

CROSS-REFERENCES TO RELATED APPLICATIONS

This application claims priority of Korean patent application numbers 10-2007-0047500 & 10-2007-0064134, filed on May 16, 2007 & Jun. 28, 2007, which are incorporated by reference in their entirety.

BACKGROUND OF THE INVENTION

The present subject matter relates to a semiconductor device, and more particularly, to a detector for detecting skew information according to process, voltage and temperature, and a delay locked loop (DLL) that can guarantee an initial delay time using the detector, regardless of process, voltage, and temperature (PVT).

Generally, semiconductor memory devices such as a double data rate synchronous dynamic random access memory (DDR SDRAM) are designed to receive an external clock (CLK_EXT) to generate an internal clock (CLK_INN). The internal clock (CLK_INN) is used as a reference for adjusting an operation timing. Therefore, clock synchronization circuits are used for synchronizing the timing of the external clock (CLK_EXT) with that of the internal clock (INN). Examples of the clock synchronization circuits include a phase locked loop (PLL) and a delay locked loop (DLL).

The PLL having a frequency multiplication function is widely used when the frequency of the external clock (CLK_EXT) is different from that of the internal clock (CLK_INN). The DLL is widely used when the frequency of the external clock (CLK_EXT) is equal to that of the internal clock (CLK_INN). The PLL has a structure similar to that of the DLL. However, the PLL uses a voltage controlled oscillator (VCO) to generate the internal clock (CLK_INN), while the DLL uses a voltage controlled delay line (VCDL).

A semiconductor memory device includes a very large number of resistors, capacitors, and transistors. The semiconductor memory device performs a variety of operations according to combinations of the resistors, the capacitors, and the transistors.

PVT characteristics of the resistors, the capacitors, and the transistors may vary with process, voltage, and temperature. Especially, the operating speeds of the capacitors and the transistors may vary according to the PVT characteristics. Due to the PVT characteristics, PVT skew may be caused in the semiconductor memory device.

FIG. 1 is a block diagram of a conventional DLL.

Referring to FIG. 1, the conventional DLL includes a phase detector 110, a control voltage generator 130, a voltage controlled delay line 150, and a delay replica model 170.

The phase detector 110 detects a phase difference between an external clock CLK_EXT and a feedback clock CLK_FED to output an up detection signal DET_UP or a down detection signal DET_DN. The up detection signal DET_UP and the down detection signal DET_DN are pulse signals having pulse widths corresponding to the phase difference between the external clock CLK_EXT and the feedback clock CLK_FED.

The control voltage generator 130 outputs a voltage control signal V_CTR having a voltage level corresponding to the up detection signal DET_UP or the down detection signal DET_DN. The voltage level of the voltage control signal V_CTR increases in response to the up detection signal DET_UP but decreases in response to the down detection signal DET_DN.

The voltage controlled delay line 150 generates an internal clock CLK_INN by reflecting a delay time corresponding to the voltage control signal V_CTR on the external clock CLK_EXT. A short delay time is reflected on the external clock CLK_EXT when the voltage level of the voltage control signal V_CTR is high, and a long delay time is reflected on the external clock CLK_EXT when the voltage level of the voltage control signal V_CTR is low.

The delay replica model 170 outputs the feedback clock CLK_FED by reflecting a delay time of an actual clock/data path on the internal clock CLK_INN.

Upon operation, the DLL detects the phase difference between the external clock CLK_EXT and the feedback clock CLK_FED to generate the voltage control signal V_CTR corresponding to the detected phase difference. Then, the DLL outputs the internal clock CLK_INN by reflecting the delay time corresponding to the voltage control signal V_CTR on the external clock CLK_EXT. The DLL repeats these operations until the external clock CLK_EXT has the same phase as the feedback clock CLK_FED, and finally generates the desired internal clock CLK_INN.

FIG. 2 is a circuit diagram of the voltage controlled delay line 150 illustrated in FIG. 1.

Referring to FIG. 2, the voltage controlled delay line 150 includes a plurality of delay cells 210, 230, 250 and 270 configured to reflect the delay time corresponding to the voltage control signal V_CTR on the external clock CLK_EXT.

For convenience, a reference symbol "CLK_EXT" is used to refer to a positive external clock having the same phase as the external clock CLK_EXT. A negative external clock /CLK_EXT is a clock having a phase opposite to the positive external clock CLK_EXT. Because the DLL simultaneously receives the positive external clock CLK_EXT and the negative external clock /CLK_EXT, the phase detector 110 can compare the phase difference ranging from 0 to π, not from 0 to 2π.

The first to fourth delay cells 210, 230, 250 and 270 reflect the delay time corresponding to the voltage control signal V_CTR on the input signal. The delay time becomes shorter as the voltage level of the voltage control signal V_CTR becomes higher, and becomes longer as the voltage level of the voltage control signal V_CTR becomes lower. Consequently, a rising internal clock RCLK_INN is outputted after the delay time is reflected on the positive external clock CLK_EXT through the first to fourth delay cells 210, 230, 250 and 270, and a falling internal clock FCLK_INN is outputted after the delay time is reflected on the negative external clock /CLK_EXT through the first to fourth delay cells 210, 230, 250 and 270.

In other words, the voltage controlled delay line 150 of the DLL receives the positive external clock CLK_EXT and the negative external clock /CLK_EXT to output the rising internal clock RCLK_INN and the falling internal clock FCLK_INN. Because the phase detector 110 compares the positive external clock CLK_EXT with the feedback clock CLK_FED generated by reflecting the delay time of the delay replica model 170 on the falling internal clock FCLK_INN, it can compare the phase difference ranging from 0 to π, not from 0 to 2π.

FIG. 3 is a circuit diagram of the first delay cell 210 illustrated in FIG. 2. Since the first to fourth delay cells 210, 230, 250 and 270 have the similar structure, only the structure of the first delay cell 210 will be described below.

The first delay cell 210 includes a first NMOS transistor NM1, a second NMOS transistor NM2, a first symmetrical load 310, a second symmetrical load 330, and a third NMOS transistor NM3. The first NMOS transistor NM1 has a source and a drain connected between a first output terminal /OUT and a first node N1, and a gate receiving the positive external clock CLK_EXT. The second NMOS transistor NM2 has a source and a drain connected between a second output terminal OUT and the first node N1, and a gate receiving the negative external clock /CLK_EXT. The first symmetrical load 310 is connected between an external voltage terminal VDD and the first output terminal /OUT, and the second symmetrical load 330 is connected between the external voltage terminal VDD and the second output terminal OUT. The third NMOS transistor NM3 has a source and a drain connected between the first node N1 and a ground terminal VSS, and a gate receiving a bias voltage V_BIAS.

Each of the first and second symmetrical loads 310 and 330 includes two PMOS transistors. One of the two PMOS transistors has a gate receiving the voltage control signal V_CTR and controls a current flowing through the first and second output terminals /OUT and OUT. A delay time of the first delay cell 210 is determined according to the currents flowing through the first and second output terminals /OUT and OUT.

The positive external clock CLK_EXT and the negative external clock /CLK_EXT are outputted as the rising internal clock RCLK_INN and the falling internal clock FCLK_INN after the delay time reflected in the first to fourth delay cells 210, 230, 250 and 270.

Meanwhile, it should be noticed that the initial delay time must be secured in designing the voltage controlled delay line 150. The initial delay time is a delay time that the voltage controlled delay line 150 must have in an initial operation of the DLL. The initial delay time of the voltage controlled delay line 150 will be described below with reference to FIG. 4.

FIG. 4 is a graph of an operation characteristic of the phase detector 110 illustrated in FIG. 1.

In FIG. 4, a horizontal axis represents a phase difference between the positive external clock CLK_EXT and the feedback clock CLK_FED, and a horizontal axis represents a pulse width of the up detection signal DET_UP and a pulse width of the down detection signal DET_DN. As the phase difference between the positive external clock CLK_EXT and the feedback clock CLK_FED becomes larger, the pulse width of the up detection signal DET_UP becomes longer and thus the delay time of the voltage controlled delay line 150 decreases. Hence, the phase difference between the positive external clock CLK_EXT and the feedback clock CLK_FED is reduced.

A region indicated by a dotted line is a dead zone where the phase detector 110 does not operate. The dead zone is formed near a region where the phase difference between the positive external clock CLK_EXT and the feedback clock CLK_FED is $-\pi$, 0 and $\pi$. The phase detector 110 does not operate when the phase difference between the positive external clock CLK_EXT and the feedback clock CLK_FED falls within the dead zone in the initial operation. Thus, the designer must appropriately set the initial delay time of the voltage controlled delay line 150 so that the phase difference between the positive external clock CLK_EXT and the feedback clock CLK_FED cannot fall within the dead zone.

FIGS. 5A and 5B are timing diagrams of the initial delay time.

More specifically, FIG. 5A shows a case where the voltage controlled delay line 150 normally obtains the desired initial delay time INT_N.

In this case, the phase difference between the rising edge of the feedback clock CLK_FED and the rising edge of the positive external clock CLK_EXT does not fall within the dead zone because the initial delay time INT_N is sufficiently guaranteed. The DLL performs a normal operation to synchronize the rising edge of the feedback clock CLK_FED with the rising edge of the positive external clock CLK_EXT.

FIG. 5B shows a case where the voltage controlled delay line 150 abnormally obtains the initial delay time INT_A.

In this case, the phase difference between the rising edge of the feedback clock CLK_FED and the rising edge of the positive external clock CLK_EXT is approximately $\pi$. This phase difference causes the malfunction of the phase detector 110. In serious cases, the phase detector 110 does not operate. This is called an initial lock fail of the DLL.

Meanwhile, each of the first to fourth delay cells 210, 230, 250 and 270 of the voltage controlled delay line 150 includes a plurality of transistors as illustrated in FIG. 3. Therefore, PVT skew may occur according to process, voltage and temperature. This means that the initial delay time of the voltage controlled delay line 150 becomes longer or shorter than the designer intends.

For convenience, the PVT characteristics will be classified into "TYPICAL", "FAST", and "SLOW".

"TYPICAL" refers to a case where the operating speeds of the NMOS transistor and the PMOS transistor are typical, "FAST" refers to a case where the operating speeds of the NMOS transistor and the PMOS transistor are faster than the TYPICAL case due to the PVT characteristics, and "SLOW" refers to a case where the initial delay time is longer than intended.

When the PVT characteristics are "TYPICAL", the voltage controlled delay line 150 provides the initial delay time intended by the designer. When the PVT characteristics are "FAST", the initial delay time become shorter than intended. When the PVT characteristics are "SLOW", the initial delay time becomes longer than intended.

In other words, when the PVT characteristics are "FAST", the initial delay time cannot be sufficiently guaranteed as illustrated in FIG. 5B. Therefore, the phase difference between the feedback clock CLK_FED and the positive external clock CLK_EXT falls within the dead zone. Thus, the initial lock fail of the DLL may occur. On the other hand, when the PVT characteristics are "SLOW", the initial delay time becomes too long, the phase difference between the feedback clock CLK_FED and the positive external clock CLK_EXT also falls within the dead zone. Consequently, the initial lock fail of the DLL may occur.

SUMMARY OF THE INVENTION

Embodiments of the present invention are directed to providing a DLL that can guarantee an initial delay time, regardless of process, voltage and temperature.

Embodiments of the present invention are also directed to providing a method for driving a DLL that can stably operate by setting an initial delay time according to PVT characteristics.

In accordance with an aspect of the present invention, there is provided a delay locked loop, including: a control voltage generator configured to generate a voltage control signal having a voltage level corresponding to a phase difference between an external clock and a feedback clock; a voltage controlled delay line configured to generate a plurality of output signals by reflecting a different delay time on the external clock in response to the voltage control signal; an internal clock multiplexer configured to output one of the plurality of output signals as an internal clock in response to a skew information signal; a delay replica model configured to output the feedback clock by reflecting a delay of an actual clock/data path on the internal clock; and a skew information signal generator configured to generate the skew information signal.

In accordance with an aspect of the present invention, there is provided a method for driving a delay locked loop, including: generating a voltage control signal having a voltage level corresponding to a phase difference between an external clock and a feedback clock; generating a plurality of output signals by reflecting a different delay time on the external clock in response to the voltage control signal; generating a skew information signal; outputting one of the plurality of output signals as an internal clock in response to the skew information signal; and outputting the feedback clock by reflecting a delay of an actual clock/data path on the internal clock.

In accordance with an aspect of the present invention, there is provided a semiconductor device, including: a delay unit configured to delay a first input signal to output a second input signal; a pulse generating unit configured to generate a pulse signal enabled during a period defined by the first input signal and the second input signal; a clock sampling unit configured to generate a sampling clock by sampling a reference clock in response to the pulse signal; a clock counting unit configured to count the sampling clock; and a skew information generating unit configured to generate a skew information signal in response to an output signal of the clock counting unit.

In accordance with an aspect of the present invention, there is provided a method for driving a semiconductor device, including: delaying a first input signal to output a second input signal; generating a pulse signal enabled during a period defined by the first input signal and the second input signal; generating a reference clock; generating a sampling clock by sampling the reference clock in response to the pulse signal; counting the sampling clock; and generating a skew information signal in response to a count value.

DESCRIPTION OF SPECIFIC EMBODIMENTS

Hereinafter, a semiconductor device in accordance with the present invention will be described in detail with reference to the accompanying drawings.

Figure 1:
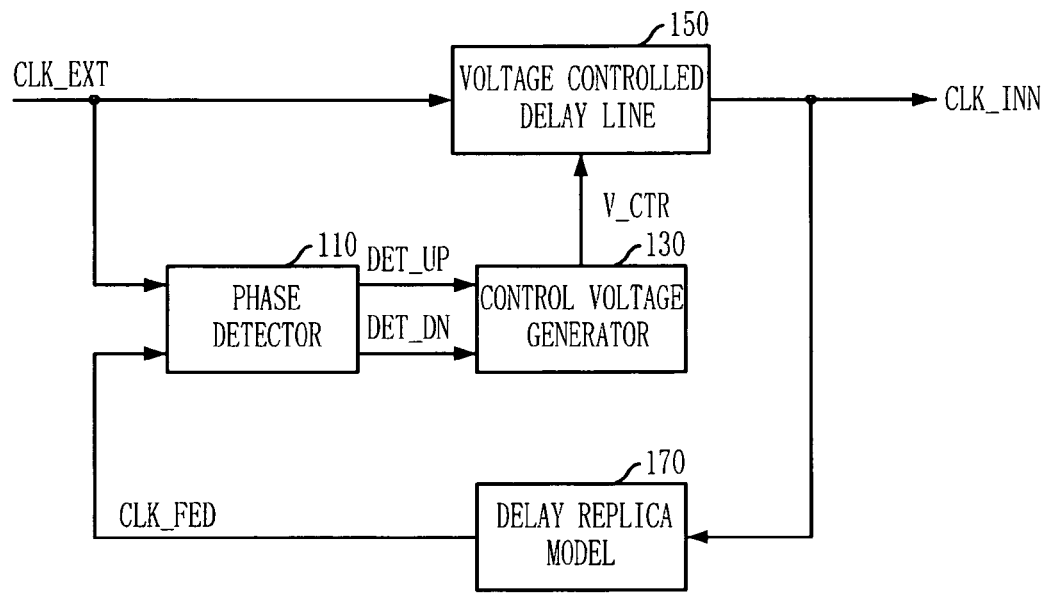
FIG. 1 is a block diagram of a conventional DLL.
Figure 2:
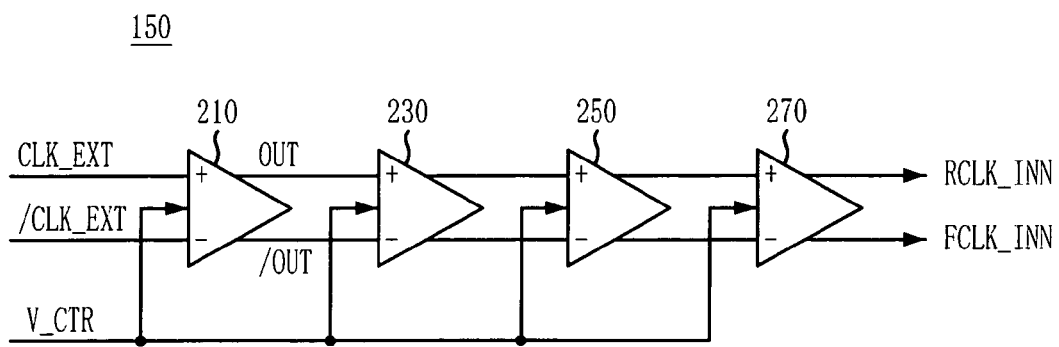
FIG. 2 is a circuit diagram of a voltage controlled delay line illustrated in FIG. 1.
Figure 3:
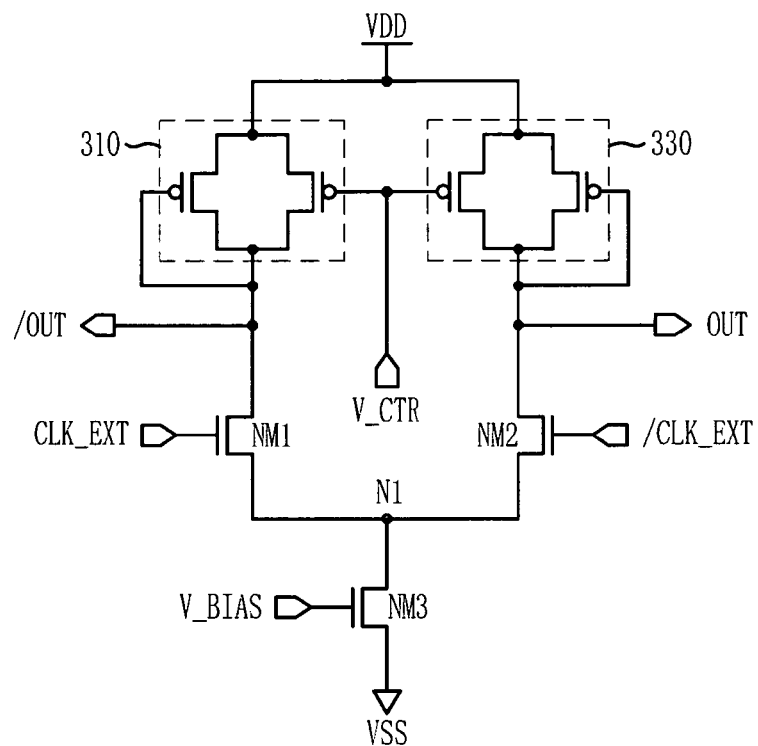
FIG. 3 is a circuit diagram of a first delay cell illustrated in FIG. 2.
Figure 4:
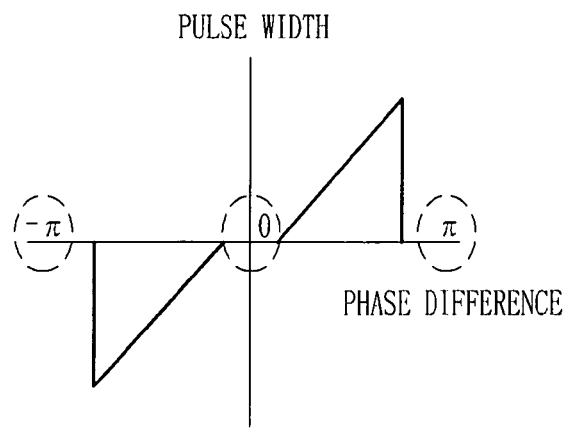
FIG. 4 is a graph of an operation characteristic of a phase detector illustrated in FIG. 1.
Figure 5A:
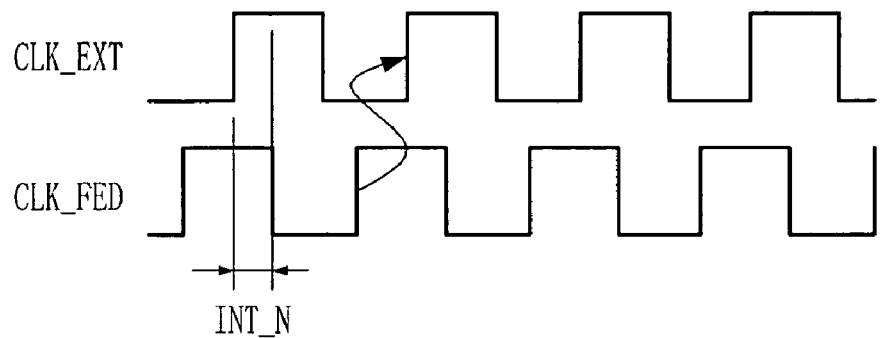
FIGS. 5A and 5B are timing diagrams of an initial delay time.
Figure 5B:
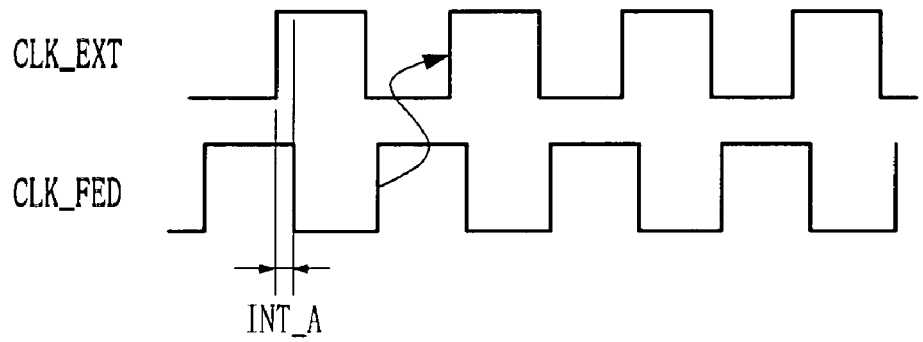
Figure 6:
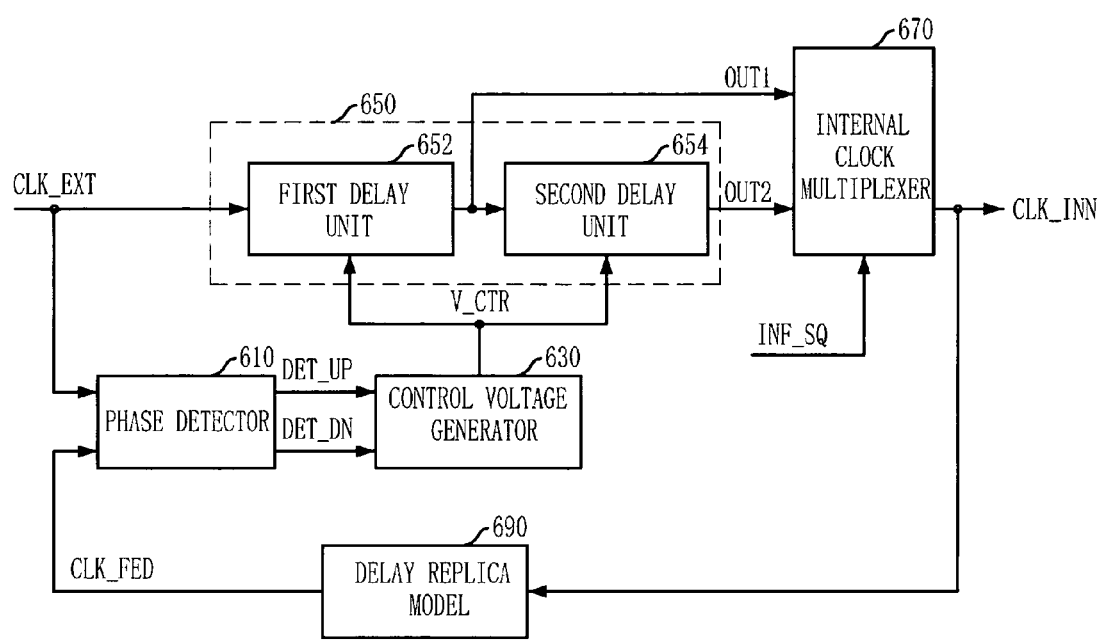
FIG. 6 is a block diagram of a DLL in accordance with an embodiment of the present invention.

FIG. 6 is a block diagram of a DLL in accordance with an embodiment of the present invention.

As shown, the DLL includes a phase detector 610, a control voltage generator 630, a voltage controlled delay line 650, an internal clock multiplexer 670, and a delay replica model 690.

The phase detector 610 detects a phase difference between an external clock CLK_EXT and a feedback clock CLK_FED to output an up detection signal DET_UP and a down detection signal DET_DN. The up detection signal DET_UP and the down detection signal DET_DN are pulse signals having pulse widths corresponding to the phase difference between the external clock CLK_EXT and the feedback clock CLK_FED.

The control voltage generator 630 outputs a voltage control signal V_CTR having a voltage level corresponding to the up detection signal DET_UP or the down detection signal DET_DN. The voltage level of the voltage control signal V_CTR increases in response to the up detection signal DET_UP but decreases in response to the down detection signal DET_DN.

The voltage controlled delay line 650 generates first and second output signals OUT1 and OUT2 by reflecting a different delay time on the external clock CLK_EXT in response to the voltage control signal V_CTR. More specifically, the voltage controlled delay line 650 includes a first delay unit 652 and a second delay unit 654. The first delay unit 652 generates the first output signal OUT1 by reflecting the delay time corresponding to the voltage level of the voltage control signal V_CTR on the external clock CLK_EXT, and the second delay unit 654 generates the second output signal OUT2 by reflecting the delay time corresponding to the voltage level of the voltage control signal V_CTR on the first output signal OUT1.

The delay time reflected by the first and second delay units 652 and 654 becomes short when the voltage level of the voltage control signal V_CTR is high, but becomes long when the voltage level of the voltage control signal V_CTR is low.

The internal clock multiplexer 670 outputs one of the first and second output signals OUT1 and OUT2 as an internal clock CLK_INN in response to a skew information signal INF_SQ. The skew information signal INF_SQ contains PVT characteristic information. Therefore, the internal clock multiplexer 670 outputs the first output signal OUT1 generated by delaying the external clock CLK_EXT or the second output signal OUT2 generated by delaying the first output signal OUT1 according to the skew information signal INF_SQ.

The delay replica model 690 outputs the feedback clock CLK_FED by reflecting a delay time of an actual clock/data path on the internal clock CLK_INN.

For convenience, the PVT characteristics will be classified into "TYPICAL", "FAST", and "SLOW".

"TYPICAL" refers to a case where the operating speeds of the NMOS transistor and the PMOS transistor are typical, "FAST" refers to a case where the operating speeds of the NMOS transistor and the PMOS transistor are faster than the TYPICAL case due to the PVT characteristics, and "SLOW"

refers to a case where the operating speeds of the NMOS transistor and the PMOS transistor are slower than the "TYPICAL" case.

According to the related art, the initial delay time of the voltage controlled delay line undesirably changes according to the PVT characteristics, so that the phase difference between the external clock CLK_EXT and the feedback clock CLK_FED falls into the dead zone. To solve the problem, the voltage controlled delay line 650 is divided into the first delay unit 652 and the second delay unit 654 and outputs the first output signal OUT1 or the second output signal OUT2 according to the skew information signal INF_SQ.

First, a case where the PVT characteristics are "FAST" will be described. When the PVT characteristics are "FAST", the phase difference between the external clock CLK_EXT and the feedback clock CLK_FED is too small due to the short initial delay time and thus it falls within the dead zone.

It is assumed that the first delay unit 652 provides an initial delay time when the PVT characteristics are "TYPICAL" intended by the designer. When the PVT characteristics are "FAST", the second output signal OUT2 delayed through the first and second delay units 652 and 654 in response to the skew information signal INF_SQ containing the FAST information is used as the internal clock CLK_INN. Therefore, the phase detector 610 compares the external clock CLK_EXT with the feedback clock CLK_FED on which the delay time is further reflected by the second delay unit 654. That is, the phase difference between the external clock CLK_EXT and the further delayed feedback clock CLK_FED can satisfy the initial delay time intended by the designer. This means that the phase difference does not fall within the dead zone.

Second, a case where the PVT characteristics are "SLOW" will be described. When the PVT characteristics are "SLOW", the phase difference between the external clock CLK_EXT and the feedback clock CLK_FED is too large due to the long initial delay time and thus it falls within the dead zone.

It is assumed that a total delay time of the first delay unit 652 and the second delay unit 654 is a time when the PVT characteristics are "TYPICAL". The first output signal OUTS delayed through the first delay unit 652 in response to the skew information signal INF_SQ containing the SLOW information is used as the internal clock CLK_INN. Therefore, the phase detector 610 compares the external clock CLK_EXT with the feedback clock CLK_FED on which the delay time of the second delay unit 654 is not reflected. That is, the phase difference between the external clock CLK_EXT and the less delayed feedback clock CLK_FED can satisfy the initial delay time intended by the designer. This means that the phase difference does not fall within the dead zone.

Figure 7:
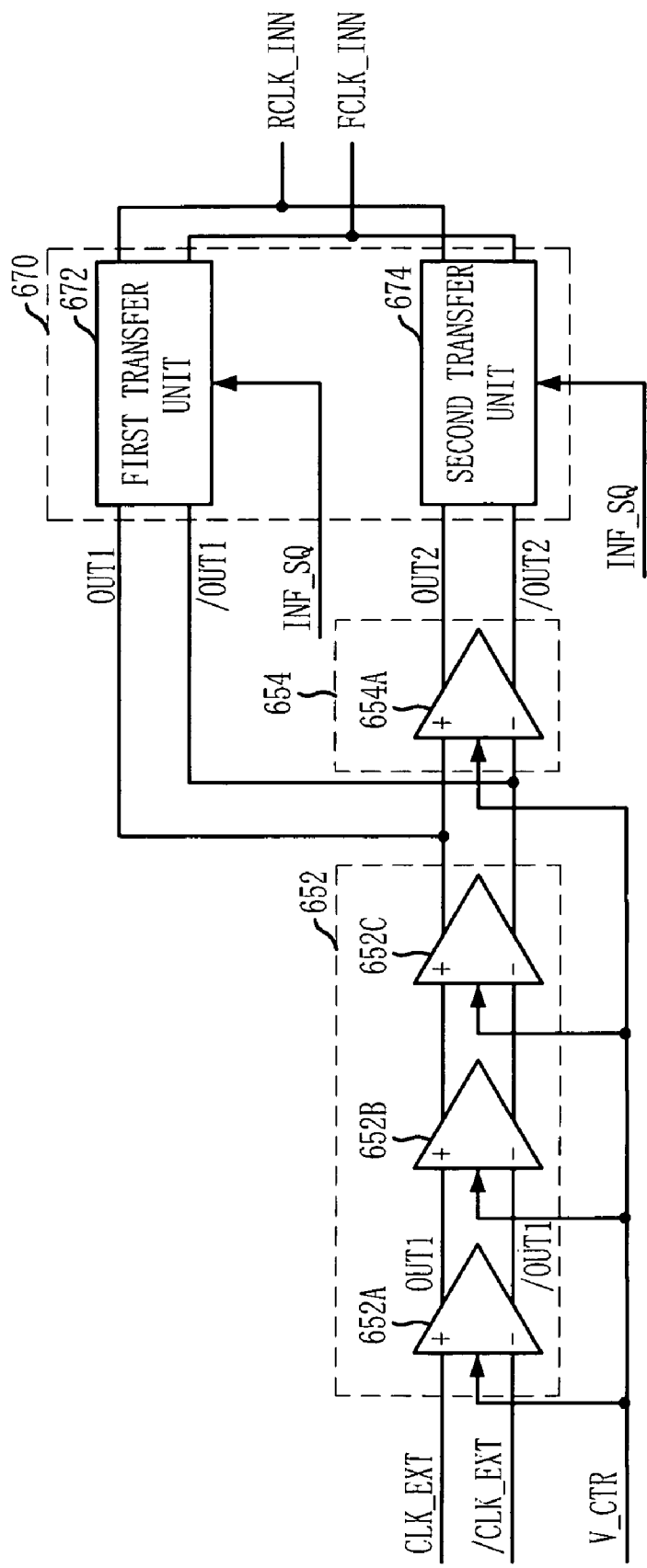
FIG. 7 is a circuit diagram illustrating a part of the DLL illustrated in FIG. 6.

FIG. 7 is a circuit diagram illustrating a part of the DLL illustrated in FIG. 6.

The first and second delay units 652 and 654 of the voltage controlled delay line 650 and the internal clock multiplexer 670 in the DLL are illustrated in FIG. 7. For convenience, a reference symbol "CLK_EXT" is used to refer to a positive external clock having the same phase as the external clock CLK_EXT. A negative external clock /CLK_EXT is a clock having a phase opposite to the positive external clock CLK_EXT. In addition, like the positive and negative external clocks CLK_EXT and /CLK_EXT, reference symbols OUT1 and /OUT1 are used to refer to the first output clocks OUT1 and reference symbols OUT2 and /OUT2 are used to refer to the second output clocks OUT2. Reference symbols "RCLK_INN" and "FCLK_INN" are used to refer to the rising internal clock and the falling internal clock.

Referring to FIG. 7, the first delay unit 652 may include first to third delay cells 652A, 652B and 652C. Each of the first to third delay cells 652A, 652B and 652C reflects the delay time corresponding to the voltage level of the voltage control signal V_CTR on its input signal. The delay time becomes shorter as the voltage level of the voltage control signal V_CTR turns higher, and becomes longer as the voltage level of the voltage control signal V_CTR turns lower. Therefore, the positive and negative external clocks CLK_EXT and /CLK_EXT are outputted as the first output signal OUT1 and /OUT1 after the delay time is reflected by the first to third delay cells 652A, 652B and 652C.

The second delay unit 654 may include a fourth delay cell 654A. The fourth delay cell 654A reflects the delay time corresponding to the voltage level of the voltage control signal V_CTR on the first output signals OUT1 and /OUT1. The first output signals OUT1 and /OUT1 are further delayed when the voltage level of the voltage control signal V_CTR is high, and are less delayed when the voltage level of the voltage control signal V_CTR is low. Therefore, the second output signals OUT2 and /OUT2 are outputted after the first output signals OUT1 and /OUT1 are delayed by the fourth delay cell 654A. Although the second delay unit 654A is implemented with a single delay cell in this embodiment, it can also be implemented with two or more delay cells only if they can compensate for the short initial delay time.

Since the first to fourth delay cells 652A, 652B, 652C and 652D are well known, their detailed description will be omitted.

The internal clock multiplexer 670 transfers the first output signals OUT1 and /OUT1 or the second output signals OUT2 and /OUT2 in response to the skew information signal INF_SQ and may include a first transfer unit 672 and a second transfer unit 674.

The first transfer unit 672 transfers the first output signals OUT1 and /OUT1 as the internal clocks RCLK_INN and FCLK_INN in response to the skew information signal INF_SQ, and the second transfer unit 674 transfers the second output signal OUT2 and /OUT2 as the internal clocks RCLK_INN and FCLK_INN in response to the skew information signal INF_SQ.

The first and second transfer units 672 and 674 may be implemented with transfer gates or a combination of logic gates.

In addition, the DLL may further include a skew information signal generator (not shown) configured to generate the skew information signal INF_SQ. The skew information signal generator will be described below with reference to FIGS. 8 to 13.

Figure 8:
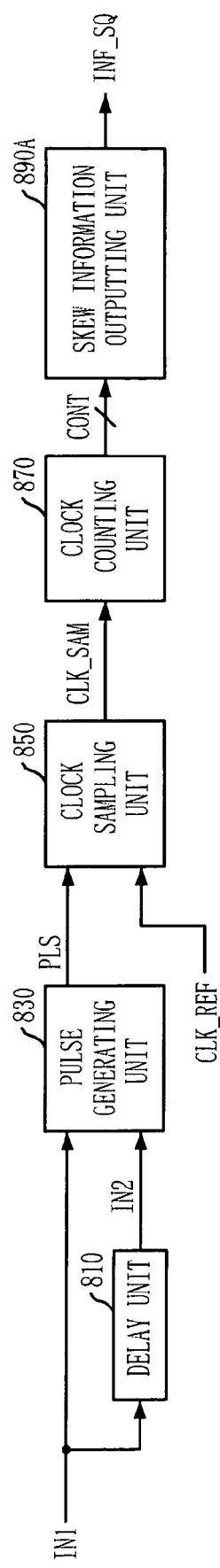
FIG. 8 is a block diagram of a skew information signal generator.

FIG. 8 is a block diagram of the skew information signal generator.

Referring to FIG. 8, the skew information signal generator includes a delay unit 810, a pulse generating unit 830, a clock sampling unit 850, a clock counting unit 870, and a skew information signal output unit 890A.

The delay unit 810 delays a first input signal IN1 to output a second input signal IN2. The delay unit 810 may include at least one delay element (not shown). The delay element may be implemented with an inverter, a capacitor, or a combination thereof. The delay time of the delay element of the delay unit 810 is changed according to the PVT characteristics. When the PVT characteristics are "FAST", the delay time provided from the delay unit 810 is shorter than that of the "TYPICAL" case. When the PVT characteristics are "SLOW", the delay time provided from the delay unit 810 is longer than that of the "TYPICAL" case. That is, the delay time of the second input signal IN2 is changed with respect to the first input signal IN1 according to the PVT characteristics.

The pulse generating unit 830 generates a pulse signal PLS enabled during a period defined by the first and second input signals IN1 and IN2.

The clock sampling unit 850 generates a sampling clock CLK_SAM by sampling a reference clock CLK_REF in response to the pulse signal PLS.

Upon operation, the skew information signal generator generates the pulse signal PLS enabled during a period defined by the first input signal IN1 and the second input signal IN2, and samples the reference clock CLK_REF during the period in which the reference clock CLK_REF is enabled.

The clock counting unit 870 counts the sampling clock CLK_SAM and may be implemented with a bit counter. Since the bit counter is well known, its detailed description will be omitted. The bit counter outputs an N-bit count signal CONT (where N is a natural number) corresponding to the clock number of the sampling clock CLK_SAM. For example, a 3-bit bit counter is used when the clock number of the sampling clock CLK_SAM is 3.

The skew information signal output unit 890A generates the skew information signal INF_SQ in response to the 3-bit count signal CONT. The maximum number that can be expressed by the skew information signal INF_SQ may be equal to the maximum number of cases that can be expressed by the count signal CONT. For example, the 3-bit count signal CONT can be detected as maximum eight skew information signals.

Figure 9:
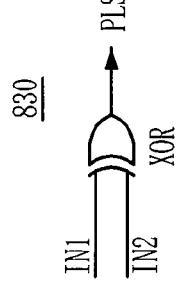
FIG. 9 is a circuit diagram of a pulse generating unit illustrated in FIG. 8.

FIG. 9 is a circuit diagram of the pulse generating unit 830 illustrated in FIG. 8.

Referring to FIG. 9, the pulse generating unit 830 may include an exclusive OR gate XOR configured to receive the first and second input signals IN1 and IN2 to output the pulse signal PLS. Therefore, the pulse signal PLS has a pulse width defined by the first and second input signals IN1 and IN2. That is, the pulse signal PLS is set in response to the first input signal IN1 and is reset in response to the second input signal IN2.

Figure 10:
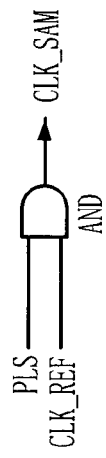
FIG. 10 is a circuit diagram of a clock sampling unit illustrated in FIG. 8.

FIG. 10 is a circuit diagram of the clock sampling unit 850 illustrated in FIG. 8.

Referring to FIG. 10, the clock sampling unit 850 may include an AND gate AND configured to receive the pulse signal PLS and the reference clock CLK_REF to output the sampling clock CLK_SAM. Therefore, the sampling clock CLK_SAM outputted from the clock sampling unit 850 is toggled only during a period defined by the pulse signal PLS.

In addition, the DLL may further include a reference clock generator (not shown) for generating the reference clock CLK_REF. The reference clock generator generates a clock signal having a stable frequency and may be implemented with a crystal oscillator.

Figure 11:
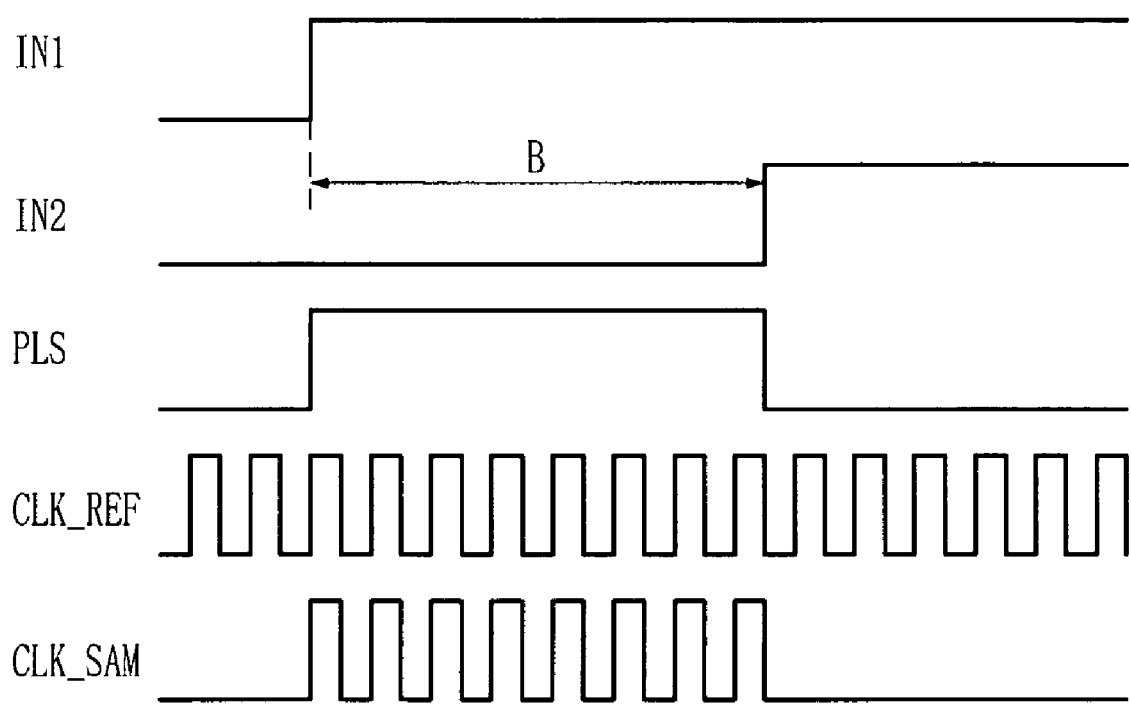
FIG. 11 is a timing diagram of an operation of the skew information signal generator shown in FIG. 8.

FIG. 11 is a timing diagram illustrating an operation of the skew information signal generator.

The timing diagram of the input signal IN1, the second input signal IN2, the pulse signal PLS, the reference signal CLK_REF, and the sampling clock CLK_SAM is illustrated in FIG. 11.

Referring to FIGS. 8 and 11, the delay unit 810 outputs the second input signal IN2 by delaying the first input signal IN1 by a predetermined time "B". The pulse signal PLS is enabled during a period defined by the first input signal IN1 and the second input signal IN2. That is, the pulse signal PLS is set to a logic high level in a low-to-high transition of the first input signal IN1, and is reset to a logic low level in a low-to-high transition of the second input signal IN2. The clock sampling unit 850 generates the sampling clock CLK_SAM by sampling the reference clock CLK_REF during a period in which the pulse signal PLS is enabled.

The clock number of the sampling clock CLK_SAM is changed according to the PVT characteristics. It is assumed that the "B" period is a "TYPICAL" case.

The "B" period determines the pulse width of the pulse signal PLS, and the clock number of the reference clock CLK_SAM contained within the determined pulse with is the clock number of the sampling clock CLK_SAM. Since the operating speed when the PVT characteristics are "SLOW" is slower than that when the PVT characteristics are "TYPICAL", the delay time becomes long and the "B" period increases. Consequently, the pulse width of the pulse signal PLS increases and the clock number of the sampling clock CLK_SAM increases. Since the operating speed when the PVT characteristics are "FAST" is faster than that when the PVT characteristics are "TYPICAL", the delay time becomes short and the "B" period decreases. Consequently, the pulse width of the pulse signal PLS decreases and the clock number of the sampling clock CLK_SAM decreases. Accordingly, the PVT characteristics can be detected using the clock number of the sampling clock CLK_SAM.

It is assumed that the clock number of the sampling clock CLK_SAM is six when the PVT characteristics are "TYPICAL".

When the PVT characteristics are "FAST", the clock number of the sampling clock CLK_SAM becomes less than six. The skew information signal INF_SQ having the information representing the PVT characteristics are "FAST" can be obtained in response to the corresponding count signal CONT.

When the PVT characteristics are "SLOW", the clock number of the sampling clock CLK_SAM becomes more than six. The skew information signal INF_SQ having the information representing the PVT characteristics are "SLOW" can be obtained in response to the corresponding count signal CONT.

As described above, the DLL can adjust the initial delay time of the voltage controlled delay line 650 according to the PVT characteristics by using the skew information signal INF_SQ. Therefore, the initial delay time can be stably guaranteed, thereby preventing the initial lock fail of the DLL.

Further, the skew information signal generator can be used for detecting PVT characteristics of a semiconductor device, which will be described below with reference to FIG. 12.

Figure 12:
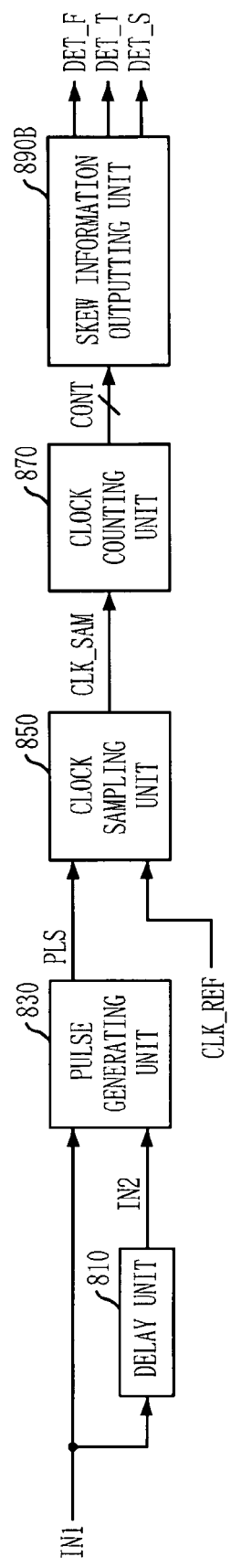
FIG. 12 is a block diagram of a skew information signal generator when it is used for detecting PVT characteristics of a semiconductor device.

FIG. 12 is a block diagram of the skew information signal generator when it is used for detecting PVT characteristics of a semiconductor device. In FIGS. 8 and 12, like reference numerals are used to refer to like elements.

The skew information signal generator outputs first to third skew information signals DET_F, DET_T and DET_S corresponding to the PVT characteristics. More specifically, the first skew information signal DET_F is a signal enabled when the PVT characteristics are "FAST", the second skew information signal DET_T is a signal enabled when the PVT characteristics are "TYPICAL", and the third skew information signal DET_S is a signal enabled when the PVT characteristics are "SLOW".

Figure 13:
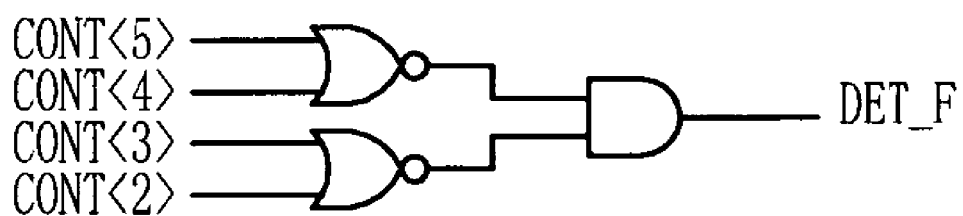
FIG. 13 is a circuit diagram of a skew information signal output unit illustrated in FIG. 12.
Figure 13:
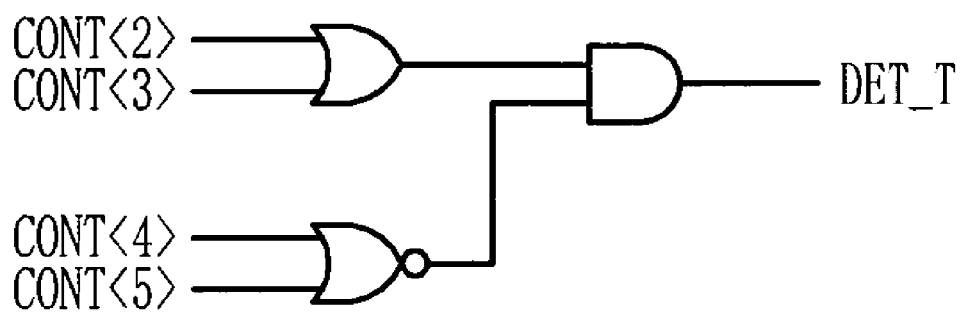
Figure 13:
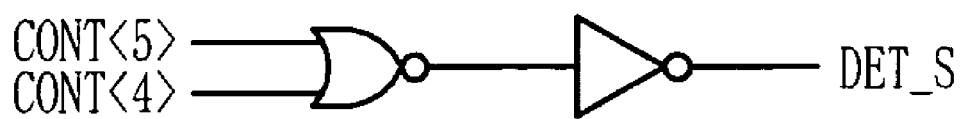

FIG. 13 is a circuit diagram of the skew information signal output unit 890B illustrated in FIG. 12.

Referring to FIG. 13, the skew information signal output unit 890B receives a 6-bit count signal CONT<0:5> to output first to third skew information signals DET_F, DET_T and DET_S. CONT<5> is a most significant bit (MSB) and CONT<0> is a least significant bit (LSB).

The first skew information signal DET_F is enabled when the PVT characteristics are "FAST", so that the circuit fast operates. Therefore, the second input signal IN2 is generated by delaying the first input signal IN1 by a delay time less than intended. Consequently, the "B" period is shortened and a small number of sampling clocks CLK_SAM are counted. For example, when the number of the sampled clocks is three, the first skew information signal DET_F is enabled according to the count value. That is, the first skew information signal DET_F is enabled when the count signals CONT<5>, CONT<4>, CONT<3> and CONT<2> are all at a logic low level. When the count signal CONT<0> is at a logic high level or the count signal CONT<1> is at a logic high level or the count signals CONT<0> and CONT<1> are at a logic high level, the number of the sampled clocks is equal to or less than three. Thus, the first skew information signal DET_F indicating that the PVT characteristics are "FAST" is detected.

When the number of the sampled clocks is equal to or greater than four and equal to or less than fifteen, the second skew information signal DET_T is enabled according to the count value. That is, the second skew information signal DET_T is enabled when one of the count signals CONT<2> and CONT<3> is at a logic high level, regardless of the count signals CONT<0> and CONT<1>. In other words, when the count signals CONT<4> and CONT<5> are at a logic low level and one of the count signals CONT<2> and CONT<3> is at a logic high level, the number of the sampled clocks is equal to or greater than four and equal to or less than fifteen. Therefore, the second skew information signal DET_T indicating that the PVT characteristics are "TYPICAL" is detected.

When the number of the sampled clocks is equal to or greater than sixteen, the third skew information signal DET_S is enabled according to the count value. That is, the third skew information signal DET_S is enabled when one of the count signals CONT<4> and CONT<5> is at a logic high level, regardless of the count signals CONT<0>, CONT<1>, CONT<2> and CONT<3>. In other words, since the number of the sampled clocks is equal to or greater than sixteen, the third skew information signal DET_S indicating that the PVT characteristics are "SLOW" is detected.

A method for controlling the DLL more precisely is to increase the pulse width B by increasing the delay time, or to increase a frequency of the reference clock CLK_REF. In this case, the bit counter is appropriately modified.

As described above, the reference clock is sampled during a period defined by the delay time varying according to process, voltage and temperature, and the sampled reference clocks are counted. In this way, the skew information corresponding to the PVT characteristics can be obtained.

Although it has been described that the second output signal OUT2 is generated by reflecting the delay time of the first and second delay units 652 and 654, the first and second delay units 652 and 654 can also output the first and second output signals OUT1 and OUT2 by reflecting a different delay time on the external clock CLK_EXT.

Further, although it has been described that the pulse generating unit 830 is implemented with the exclusive OR gate and the clock sampling unit 850 is implemented with the AND gate, the pulse generating unit 830 and the clock sampling unit 850 can also be implemented with various kinds of logic gates and their combination. It should be noticed that the positions and kinds of the logic gates may be changed according to polarities of the input signals.

Moreover, although three skew information signals have been described above, more than three skew information signals can be detected.

In accordance with the embodiments of the present invention, because the skew information according to process, voltage and temperature applied to the semiconductor device can be detected, useful information can be provided to circuits in which margin errors may occur due to the skew.

Further, the initial lock fail can be prevented because the initial delay time is guaranteed regardless of process, voltage and temperature.

Moreover, because the initial delay time is guaranteed, the DLL performs a stable locking operation, thereby generating a reliable internal clock While the present invention has been described with respect to the specific embodiments, it will be apparent to those skilled in the art that various changes and modifications may be made without departing from the spirit and scope of the invention as defined in the following claims.

What is claimed is:

1. A semiconductor device, comprising:
a delay unit configured to delay a first input signal to output a second input signal;
a pulse generating unit configured to generate a pulse signal enabled during a period defined by the first input signal and the second input signal;
a clock sampling unit configured to generate a sampling clock by sampling a reference clock in response to the pulse signal;
a clock counting unit configured to count the sampling clock; and
a skew information generating unit configured to generate a skew information signal in response to an output signal of the clock counting unit.

2. The semiconductor device as recited in claim 1, wherein the pulse signal is set in response to the first input signal and is reset in response to the second input signal.

3. The semiconductor device as recited in claim 1, wherein the pulse generating unit comprises an exclusive OR gate configured to receive the first input signal and the second input signal to output the pulse signal.

4. The semiconductor device as recited in claim 1, wherein the clock sampling unit comprises an AND gate configured to receive the pulse signal and the reference clock to output the sampling clock.

5. The semiconductor device as recited in claim 1, wherein the sampling clock is toggled during the period defined by the first input signal and the second input signal.

6. The semiconductor device as recited in claim 5, wherein the clock counting unit outputs an N-bit code signal corresponding to the clock number of the toggled sampling clock, N being a natural number.

7. The semiconductor device as recited in claim 6, wherein the number of the skew information signal corresponds to the N-bit code signal.

8. The semiconductor device as recited in claim 1, wherein the skew information signal corresponds to process, voltage and temperature (PVT) characteristics.

9. A method for driving a semiconductor device, comprising:
delaying a first input signal to output a second input signal;
generating a pulse signal enabled during a period defined by the first input signal and the second input signal;
generating a reference clock;
generating a sampling clock by sampling the reference clock in response to the pulse signal;
counting the sampling clock; and
generating a skew information signal in response to a count value.

10. The method as recited in claim 9, wherein the pulse signal is set in response to the first input signal and is reset in response to the second input signal.

11. The method as recited in claim 9, wherein the sampling clock is toggled during the period defined by the first input signal and the second input signal.

12. The method as recited in claim 11, wherein the counting of the sampling clock comprises outputting an N-bit code signal corresponding to the clock number of the sampling clock, N being a natural number.

* * * * *